US010818557B2

(12) United States Patent
Gu et al.

(10) Patent No.: US 10,818,557 B2
(45) Date of Patent: Oct. 27, 2020

(54) INTEGRATED CIRCUIT STRUCTURE TO REDUCE SOFT-FAIL INCIDENCE AND METHOD OF FORMING SAME

(71) Applicant: GLOBALFOUNDRIES INC., Grand Cayman (KY)

(72) Inventors: Sipeng Gu, Clifton Park, NY (US); Akshey Sehgal, Malta, NY (US); Xinyuan Dou, Clifton Park, NY (US); Sunil K. Singh, Mechanicville, NY (US); Ravi P. Srivastava, Clifton Park, NY (US); Haiting Wang, Clifton Park, NY (US); Scott H. Beasor, Greenwich, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/026,130

(22) Filed: Jul. 3, 2018

(65) Prior Publication Data
US 2020/0013678 A1    Jan. 9, 2020

(51) Int. Cl.
*H01L 21/8234* (2006.01)
*H01L 29/423* (2006.01)
(Continued)

(52) U.S. Cl.
CPC ........... *H01L 21/823475* (2013.01); *H01L 21/31053* (2013.01); *H01L 21/31111* (2013.01);
(Continued)

(58) Field of Classification Search
CPC ......... H01L 21/823475; H01L 29/6656; H01L 21/32133; H01L 29/42392; H01L 29/7851;
(Continued)

(56) References Cited

U.S. PATENT DOCUMENTS 7,829,454 B2  11/2010 Suzuki
8,084,311 B1  12/2011 Horak et al.
(Continued)

OTHER PUBLICATIONS

J. Mitard et al., "First Demonstration of Strained Ge-in-STI IFQW pFETs Featuring Raised SiGe75% S/D, Replacement Metal Gate and Germanided Local Interconnects," conference paper in Digest of Technical Papers—Symposium on VLSI Technology, Jan. 2013, retrieved from https://www.researchgate.net/publication/261025067 on May 25, 2018 5 pages.
(Continued)

*Primary Examiner* — Thanh T Nguyen
(74) *Attorney, Agent, or Firm* — Francois Pagette; Hoffman Warnick LLC

(57) ABSTRACT

This disclosure is directed to an integrated circuit (IC) structure. The IC structure may include a semiconductor structure including two source/drain regions; a metal gate positioned on the semiconductor structure adjacent to and between the source/drain regions; a metal cap with a different metal composition than the metal gate and having a thickness in the range of approximately 0.5 nanometer (nm) to approximately 5 nm positioned on the metal gate; a first dielectric cap layer positioned above the semiconductor structure; an inter-layer dielectric (ILD) positioned above the semiconductor structure and laterally abutting both the metal cap and the metal gate, wherein an upper surface of the ILD has a greater height above the semiconductor structure than an upper surface of the metal gate; a second dielectric cap layer positioned on the ILD and above the metal cap; and a contact on and in electrical contact with the metal cap.

19 Claims, 6 Drawing Sheets

(51) Int. Cl.
| | |
|---|---|
| *H01L 23/48* | (2006.01) |
| *H01L 29/78* | (2006.01) |
| *H01L 27/088* | (2006.01) |
| *H01L 29/06* | (2006.01) |
| *H01L 29/49* | (2006.01) |
| *H01L 21/3105* | (2006.01) |
| *H01L 21/311* | (2006.01) |
| *H01L 21/3213* | (2006.01) |
| *H01L 21/768* | (2006.01) |
| *H01L 29/66* | (2006.01) |
| *H01L 29/08* | (2006.01) |

(52) U.S. Cl.
CPC .. *H01L 21/32133* (2013.01); *H01L 21/76802* (2013.01); *H01L 21/76877* (2013.01); *H01L 21/823431* (2013.01); *H01L 23/481* (2013.01); *H01L 27/0886* (2013.01); *H01L 29/0673* (2013.01); *H01L 29/0847* (2013.01); *H01L 29/42372* (2013.01); *H01L 29/42392* (2013.01); *H01L 29/4966* (2013.01); *H01L 29/6656* (2013.01); *H01L 29/66795* (2013.01); *H01L 29/7851* (2013.01)

(58) Field of Classification Search
CPC ........... H01L 21/31053; H01L 29/0847; H01L 29/66795; H01L 21/76802; H01L 21/76877; H01L 21/31111; H01L 29/4966; H01L 29/0673; H01L 23/481; H01L 21/823431; H01L 27/0886; H01L 29/42372
See application file for complete search history.

(56) References Cited

U.S. PATENT DOCUMENTS

| | | |
|---|---|---|
| 8,772,168 B2 | 7/2014 | Xie et al. |
| 8,890,262 B2 | 11/2014 | Kamineni et al. |
| 9,054,178 B2 | 6/2015 | Bohr et al. |
| 9,064,801 B1 | 6/2015 | Horak et al. |
| 9,070,625 B2 | 6/2015 | Fitzsimmons et al. |
| 9,466,676 B2 | 10/2016 | Kamineni et al. |
| 9,524,935 B2 | 12/2016 | Rullan et al. |
| 2010/0276757 A1 | 11/2010 | Doyle et al. |
| 2011/0147341 A1 | 6/2011 | Sato et al. |
| 2015/0228793 A1* | 8/2015 | Chen ................. H01L 21/76805 257/401 |
| 2017/0186743 A1* | 6/2017 | Chiou ................... H01L 29/785 |
| 2017/0345945 A1* | 11/2017 | Lee ....................... H01L 29/775 |

OTHER PUBLICATIONS

Kim et al., "L g=80-nm Trigate Quantum-Well In0.53Ga0.47As Metal-Oxide-Semiconductor Field-Effect Transistors With Al2O3/HfO2 Gate-Stack," IEEE Electron Device Letters, vol. 36, Issue 3, Mar. 2015, 3 pages.

Mitard et al., "First demonstration of 15nm-WFIN inversion-mode relaxed-Germanium n-FinFETs with Si-cap free RMG and NiSiGe Source/Drain," Electron Devices Meeting (IEDM), 2014 IEEE International, 5 pages.

Witters et al., "Strained germanium quantum well p-FinFETs fabricated on 45nm Fin pitch using replacement channel, replacement metal gate and germanide-free local interconnect," VLSI Technology (VLSI Technology), 2015 Symposium, 2 pages.

* cited by examiner

INTEGRATED CIRCUIT STRUCTURE TO REDUCE SOFT-FAIL INCIDENCE AND METHOD OF FORMING SAME

BACKGROUND

Technical Field

The present disclosure relates to integrated circuit (IC) manufacture. More particularly, the disclosure relates to forming recessed metal caps on a metal gate to enhance reliability and improve manufacturability.

Related Art

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal which is chosen to create desired characteristics of the FET. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Fin-type field effect transistors ("FinFETs") have become increasingly widespread because FinFETs offer better electrostatic control over the behavior in the channel than planar FETs. FinFETs are formed by creating a number of semiconductor fins on a substrate and placing a gate conductor perpendicularly across the fins. A FinFET is created by the gate forming a channel region below the gate in the fin, and source/drain regions formed in the fin aside the gate. Continued development of transistor architectures has yielded dimensional improvements to FET technology, such as "gate all around" (GAA) device architectures.

GAA transistors provide a structure similar to a FinFET in which the work function metal wraps completely around a semiconductor channel material within a two dimensional space. GAA transistors may be preferable where significantly reduced gate lengths are required in a circuit design. GAA transistors may provide a higher amount of contact area between the work function metal and the semiconductor channel as compared to conventional devices. However, GAA transistors are more difficult to form than FinFET transistors and may have competing constraints.

GAA transistors can be formed as vertical (vGAA) devices or horizontal (hGAA) devices. The vGAA devices are commonly formed with sets of vertically oriented, horizontally separated fins. The hGAA devices are commonly formed with a nanosheet or nanowire stack including horizontally oriented, vertically spaced nanosheets or nanowires. Conventionally, adjacent pFET and nFET structures are fabricated as a single type of GAA device, such as two adjacent hGAA devices or vGAA devices.

Manufacturing of ICs typically includes planarization steps. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. If the resulting planarized surface includes both exposed metal circuit elements, such as metal gates, and a dielectric, the planarization may leave a metal residue on the upper surface of the dielectric. This metal residue remains on the surface despite subsequent conventional cleaning steps. Subsequent manufacturing steps typically form additional layers on top of the metal residue, trapping the metal residue between layers.

Subsequent manufacturing steps may also involve forming conductive contacts which penetrate the previously planarized dielectric surface and the trapped metal residue. Conductive contacts are often spaced in close proximity on a horizontal plane. Metal residue between layers may form unwanted conductive paths, such as metallic stringers, between adjacent contacts which are intended to be electrically isolated from each other. For example, contacts to source/drain regions and to the associated gate are typically in close proximity, yet are typically intended to be electrically isolated. Contacts to underlying through silicon vias (TSVs) are another type of contact which may be in close proximity to other contacts. Unwanted conductive paths can lead to failures in the completed IC or to rejection of the IC as a result of testing performed during manufacturing. Experiments show that soft failures due to metal residue can occur during high-voltage stress tests.

SUMMARY

All examples and features mentioned below can be combined in any technically possible way.

Various embodiments of the disclosure include methods of forming integrated circuits. Various additional embodiments of the disclosure include IC structures, such as metal gates, formed according to the disclosed methods.

A first aspect of the disclosure is directed to an integrated circuit (IC) structure including: a semiconductor structure; a first source/drain region formed in the semiconductor structure; a second source/drain region formed in the semiconductor structure; a metal gate positioned on the semiconductor structure adjacent to and between the first source/drain region and the second source/drain region, the metal gate including a first metal; a metal cap positioned on the metal gate, wherein the metal cap has a different metal composition than the first metal, and wherein the metal cap has a thickness in the range of approximately 0.5 nanometer (nm) to approximately 5 nm; a first dielectric cap layer positioned on at least a portion of the semiconductor structure; a first inter-layer dielectric (ILD) positioned above the semiconductor structure and laterally abutting both the metal cap and the metal gate, wherein a height of an upper surface of the first ILD above the semiconductor structure is greater than a height of an upper surface of the metal gate above the semiconductor structure; a second dielectric cap layer positioned on the first ILD and above the metal cap; and a first contact on and in electrical contact with an upper surface of the metal cap, wherein the second dielectric cap layer laterally abuts a portion of the first contact.

A second aspect of the disclosure is directed to an integrated circuit (IC) structure including: a semiconductor structure; a first source/drain region formed in the semiconductor structure; a second source/drain region formed in the semiconductor structure; a gate stack positioned on the semiconductor structure adjacent to and between the first source/drain region and the second source/drain region, the gate stack including: a high-K dielectric liner on the semiconductor structure; a work function metal in contact with the liner; and a conductive plug in contact with the work function metal; a metal cap positioned on the gate stack, wherein the metal cap has a different metal composition than the work function metal and the conductive plug, and wherein the metal cap has a thickness in the range of approximately 0.5 nanometer (nm) to approximately 5 nm; a first dielectric cap layer positioned on at least a portion of the semiconductor structure; a first inter-layer dielectric (ILD) positioned above the semiconductor structure and laterally abutting both the metal cap and the gate stack, wherein a height of an upper surface of the first ILD above the semiconductor structure is greater than a height of an upper surface of the gate stack above the semiconductor structure; a second dielectric cap layer positioned on the first ILD and above the metal cap; a gate contact on and in electrical contact with an upper surface of the metal cap, wherein the second dielectric cap layer laterally abuts a portion of the gate contact; and a second contact extending through the first dielectric cap layer above and in electrical contact with the first source/drain region, wherein the second dielectric cap layer laterally abuts a portion of the second contact, and wherein the second contact is electrically isolated from the gate contact.

A third aspect of the disclosure is directed to a method of forming an integrated circuit (IC) structure including: providing a precursor structure, the precursor structure including: a semiconductor structure; a first source/drain region formed in the semiconductor structure; a second source/drain region formed in the semiconductor structure; a metal gate positioned on the semiconductor structure adjacent to and between the first source/drain region and the second source/drain region, the metal gate including a first metal; a first dielectric cap layer positioned on at least a portion of the semiconductor structure; and a first inter-layer dielectric (ILD) positioned above the semiconductor structure and laterally abutting the metal gate, planarizing an upper surface of the precursor structure, wherein an upper surface of the metal gate is exposed after the planarizing, and wherein the planarizing leaves a metal residue on at least a portion of the ILD; etching the first ILD and the upper surface of the metal gate to remove the metal residue and to recess the metal gate to a depth below an upper surface of the first ILD; forming a metal cap on the metal gate, wherein the metal cap has a different composition than the first metal, and wherein the metal cap has a thickness in the range of approximately 0.5 nanometer (nm) to approximately 5 nm; depositing a second dielectric cap layer on the first ILD and the metal cap; forming a first opening through the second dielectric cap layer above the metal cap; and forming a first contact in the first opening and in electrical contact with the metal cap.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures. In the drawings, like numbering represents like elements between the drawings.

It is noted that the drawings of the disclosure are not to scale. The drawings are intended to depict only typical aspects of the disclosure, and therefore should not be considered as limiting the scope of the disclosure.

DETAILED DESCRIPTION

In the following description, reference is made to the accompanying drawings that form a part thereof, and in which is shown by way of illustration specific representative embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Throughout this disclosure, the terms top, upper, upwards, over, and above refer to the direction away from the substrate. Likewise, the terms bottom, lower, downwards, under, and below refer to the direction towards the substrate.

Referring to FIGS. 1-7, cross section views are shown of an example integrated circuit undergoing processing according to embodiments of this disclosure. It is understood that embodiments of the disclosure can be implemented on different designs, for example planar FETs (see FIG. 8), FinFETs (see FIGS. 9-10), and gate-all-around FETs (see FIGS. 11-12) without any change to the techniques discussed herein.

Figure 1:
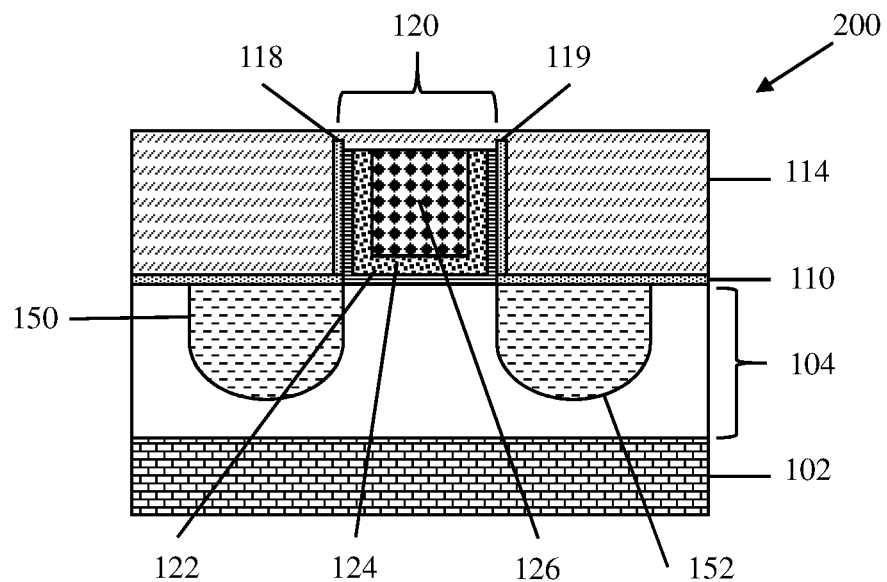
FIG. 1 shows a cross section of an example precursor structure according to embodiments of this disclosure.

FIG. 1 provides a cross section view of a precursor structure 200 to be processed according to embodiments of this disclosure. FIGS. 2-7 reference corresponding structures as described below for FIG. 1 using like reference numbers. The example precursor structure 200 illustrates one set of materials targeted for use with embodiments of the disclosure, but it is understood that embodiments of the disclosure can be implemented on different designs without any change to the techniques discussed herein. Precursor structure 200 may include a semiconductor structure 104 positioned on a substrate 102. Semiconductor structure 104 may include one or more source/drain regions 150, 152. First dielectric cap layer 110 may be positioned on the upper surface of semiconductor structure 104. Optional spacers 118, 119 may be positioned on semiconductor structure 104, e.g., on a fin included in semiconductor structure 104. Spacers 118, 119 may be positioned before or after metal gate 120 is positioned by methods known in the art, such as (without limitation) gate-first or replacement metal gate (RMG) fabrication methods. Spacers 118, 119 may be positioned above first dielectric cap layer 110 as shown. Metal gate 120 may be positioned on semiconductor structure 104 positioned in openings in first dielectric cap layer 110 and optionally between spacers 118 and 119. Metal gate 120 may include a gate dielectric 122, one or more work function metals 124, and may include a conductive plug 126. Various embodiments may include a liner, e.g., titanium nitride, (not shown) between work function metal 124 and gate dielectric 122. A first inter-layer dielectric (ILD) 114 may be positioned above first dielectric cap layer 110, spacers 118, 119, and metal gate 120.

Substrate 102 is typically a wafer of semiconductor material such as silicon, germanium, silicon germanium, silicon carbide, and those consisting essentially of III-V compound semiconductors such as GaAs, II-VI compound semiconductors such as ZnSe. A substrate 102 may also comprise an organic semiconductor or a layered semiconductor such as, for example, Si/SiGe, a silicon-on-insulator or a SiGe-on-insulator. A portion or entire semiconductor substrate 102 may be amorphous, polycrystalline, or monocrystalline.

Substrate 102 and semiconductor structure 104 materials may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

Source/drain regions 150, 152 may be fabricated by any process now known or later developed in the art, and may include doping and/or epitaxial growth steps.

Doping is the process of introducing impurities (dopants) into the semiconductor substrate, or elements formed on the semiconductor substrate, and is often performed with a mask (or previously-formed, elements in place) so that only certain areas of the substrate will be doped. For example, doping is used to form the source and drain regions of an FET. An ion implanter is typically employed for the actual implantation. An inert carrier gas such as nitrogen is usually used to bring in the impurity source (dopant).

The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

First dielectric cap layer 110 may include, e.g., silicon nitride (SiN), to protect the underlying semiconductor structure 104 during various processing steps. Conventional means can be used to apply the dielectric layer, such as chemical vapor deposition (CVD). Dielectric spacers 118, 119 may include, e.g., silicon nitride (SiN) or silicon dioxide ($SiO_2$), and be formed by any process now known or later developed in the art.

Metal gate(s) 120 can be in the form of any currently known or later developed conductive material such as, e.g., aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), titanium aluminum carbide (TiAlC), tungsten (W), tungsten nitride (WN), tungsten carbide (WC), and/or polysilicon (poly-Si) or combinations thereof.

Gate dielectric 122 materials may include but are not limited to: hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials.

Work function metal 124 may include one or more distinct layers. Work function metal 124 may include titanium or various alloys containing titanium, such as titanium nitride, titanium carbide, or titanium aluminum carbide and may include barrier layers between portions with different compositions. The work function is an important property of metals used in metal gates, and is chosen to create desired characteristics of FETs. The work function is the minimum energy (usually measured in electron volts) needed to remove an electron from a solid to a point immediately outside the solid surface (or energy needed to move an electron from the Fermi energy level into vacuum). Here "immediately" means that the final electron position is far from the surface on the atomic scale but still close to the solid on the macroscopic scale.

Dielectric materials of layers 110, 112 (and layers 114, 116, see for example FIGS. 5-7) may include any interlevel or intralevel dielectric material including inorganic dielectric materials, organic dielectric materials, or combinations thereof. Suitable dielectric materials include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

FIGS. 2-12 reference corresponding structures as described above for FIG. 1 using like reference numbers.

Figure 2:
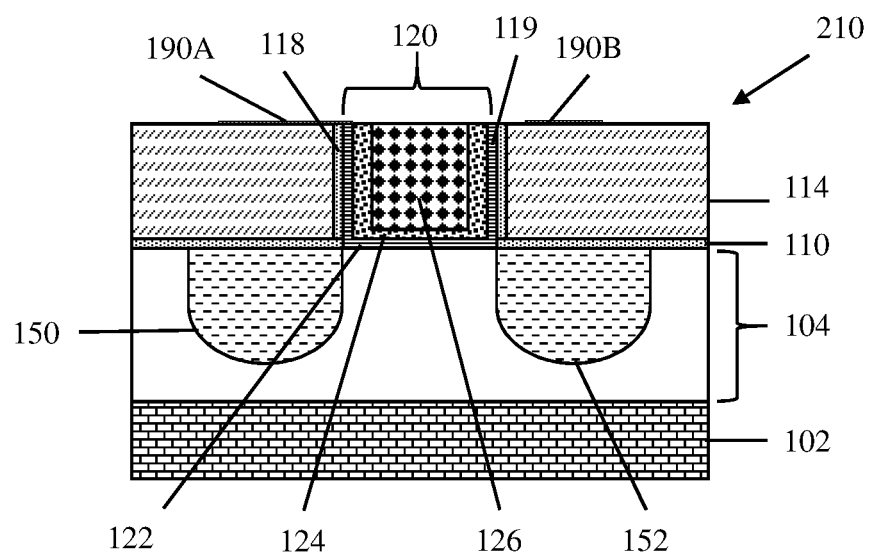
FIG. 2 shows a cross section of planarization of the example precursor structure and the resulting structure according to embodiments of this disclosure.

FIG. 2 shows a cross section of IC structure 210 resulting after planzarization of the example precursor structure 200 according to embodiments of this disclosure. Planarization refers to various processes that make a surface more planar (that is, more flat and/or smooth), such as chemical-mechanical-polishing (CMP). Planarization may remove a portion of first ILD 114, spacers 118, 119, and metal gate 120. Planarization may also leave metal residue 190 on portions of the upper surface of first ILD 114. Metal residue 190 may be in the form of small particles, thin layers, or discontinuous patches of metal. Typically, metal residue 190 will have a thickness or diameter much less than 1 nanometer. Metal residue 190 may be in the form of clumps of small numbers of atoms. Metal residue 190 may be more prevalent near regions of exposed metal. Additionally, the upper surface of metal gate 120 may be gouged during planarization.

Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This process removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Figure 3:
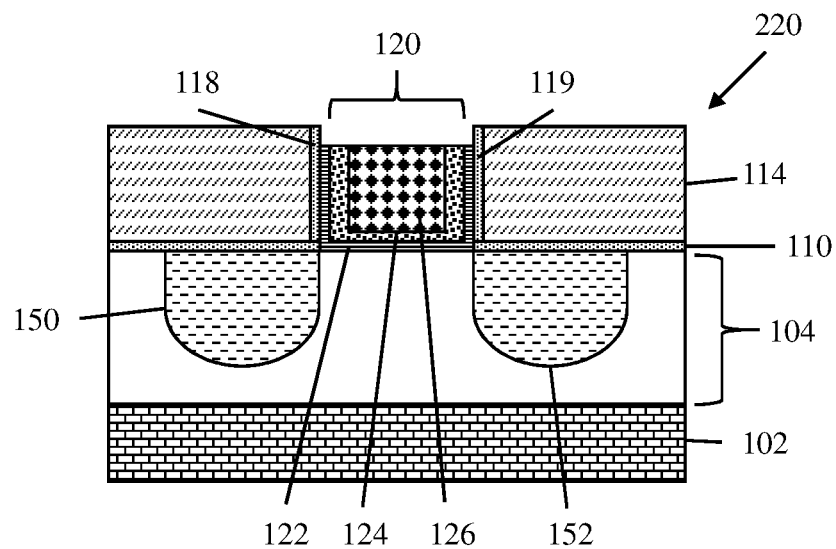
FIG. 3 shows a cross section of etching of the partially formed integrated circuit and the resulting structure according to embodiments of this disclosure.

FIG. 3 shows a cross section of IC structure 220 resulting after etching of the IC structure 210 according to embodiments of this disclosure. Etching removes a portion of the upper surface of metal gate 120 and recesses it below the upper surface of first ILD 114 and spacers 118, 119. In addition to recessing metal gate 120, etching removes metal residue 190.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. Wet etch processes are more effective at removing metal residue 190 than dry etch processes. In one embodiment of this disclosure a wet etch is performed using a solution of EKC270™ (available from EKC Technology) and hydrogen peroxide in distilled water. Concentrations of EKC270™ in the range of approximately 5% to approximately 10% and hydrogen peroxide in the range of approximately 5% to approximately 20% applied for a period of time in the range of approximately 5 seconds to approximately 15 seconds achieve a well-controlled recess depth on the upper surface of metal gate 120 as well as removing metal residue 190.

Figure 4:
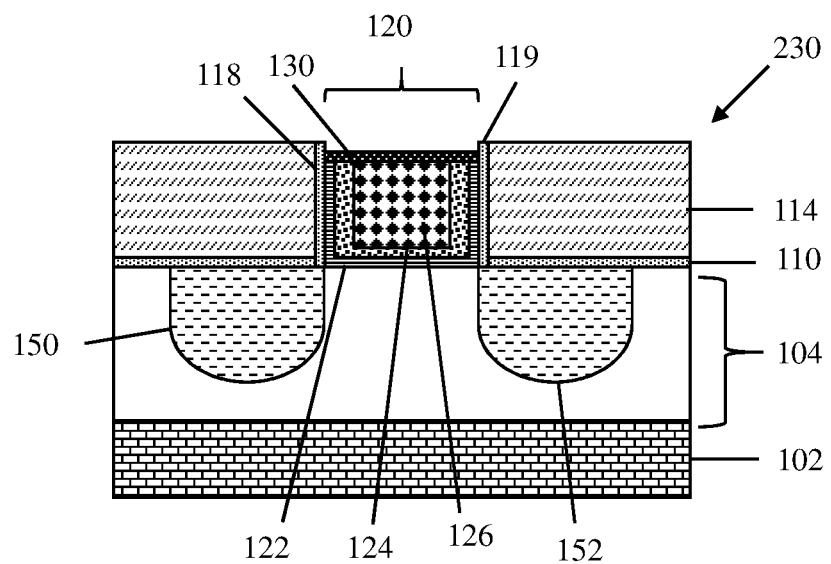
FIG. 4 shows a cross section of forming a metal cap on the partially formed integrated circuit and a cross section of the resulting structure according to embodiments of this disclosure.

FIG. 4 shows a cross section of IC structure 230 resulting after forming metal cap 130 on IC structure 220 according to embodiments of this disclosure.

Metal cap 130 may have a thickness in the range of approximately 0.5 nanometer (nm) to approximately 5 nm and have an upper surface above, below, or co-planar with the upper surface of first ILD 114. In some embodiments, a metal cap thinner than 5 nm may be preferred, for example, less than 1.5 nm. Metal cap 130 may include any metal with a different composition than materials included in metal gate 120. In one embodiment, metal cap 130 includes at least one of ruthenium (Ru), cobalt (Co), and tungsten (W). Metal cap 130 may be formed by any now known or later developed techniques appropriate for forming metal cap 130 on metal gate 120 without creating additional metal residue 190 on first ILD 114. Etching the upper surface of metal gate 120 followed by forming metal cap 130 may remove gouging in the upper surface of metal gate 120 caused by planarization, and metal cap 130 may have a smoother upper surface than metal gate 120 which is advantageous for later contact formation (see FIG. 7).

Figure 5:
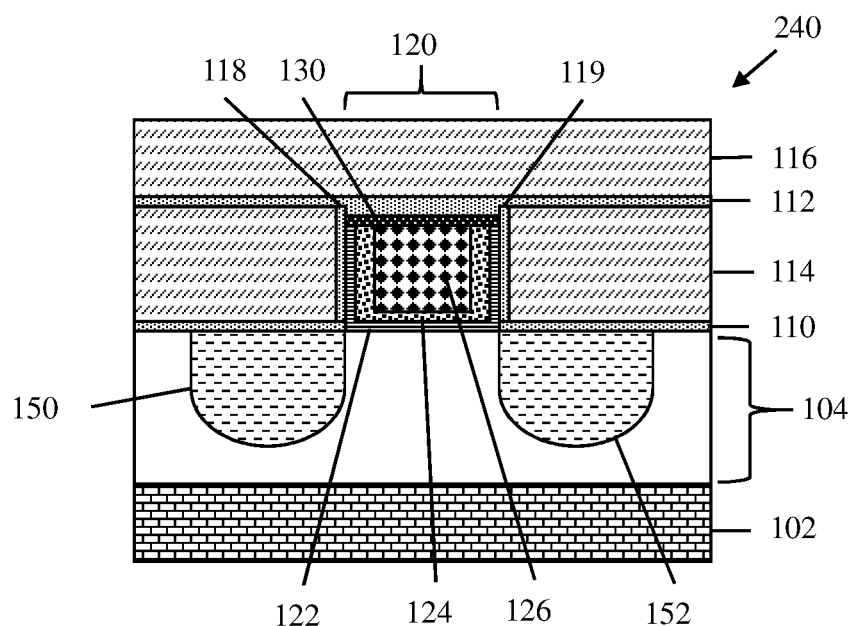
FIG. 5 shows a cross section of forming a dielectric layer on the partially formed integrated circuit and the resulting structure according to embodiments of this disclosure.

FIG. 5 shows a cross section of IC structure 240 resulting from depositing second dielectric cap layer 112 and second ILD 116 on IC structure 230 according to embodiments of this disclosure.

Second dielectric cap layer 112, and second ILD 116 may be deposited by any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 6:
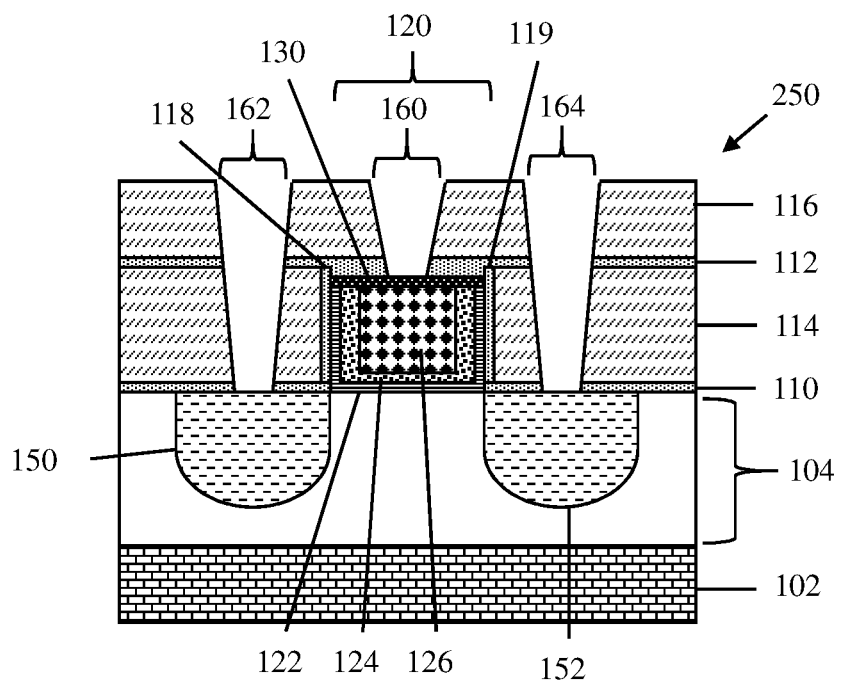
FIG. 6 shows a cross section of forming an opening in the partially formed integrated circuit and the resulting structure according to embodiments of this disclosure.

FIG. 6 shows a cross section of IC structure 250 resulting from forming contact openings 160, 162, and 164 through second dielectric cap layer 112, second ILD 116, and optionally through first ILD 114 and first dielectric cap layer 110, on IC structure 240 according to embodiments of this disclosure.

Contact openings 160, 162, 164 may be formed by any now known or later developed techniques appropriate for forming openings in IC structures, including but not limited to photolithography followed by etching.

Contacts 140, 142, 144 may be formed by any now known or later developed techniques appropriate for metallizing IC structures in contact openings 160, 162, 164, e.g., depositing a refractory metal liner, depositing a conductor such as copper, and planarizing. Forming contacts 140, 142, 144 in openings 160, 162, 164 results in IC structure 100 shown in FIG. 7, which may subsequently undergo additional processing.

Figure 7:
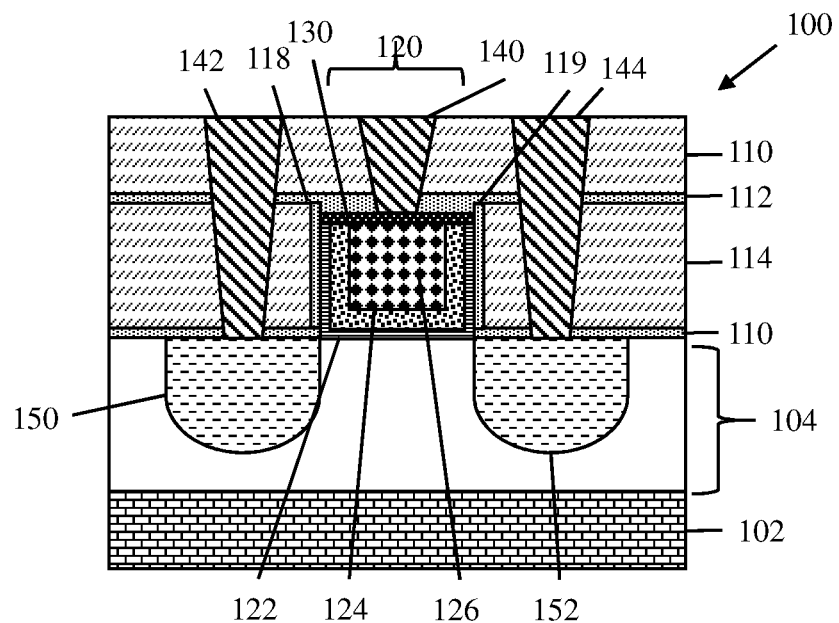
FIG. 7 shows a cross section of forming contacts on the partially formed integrated circuit and the resulting structure according to embodiments of this disclosure.

Referring to now to cross-section view of FIG. 7 and the descriptions of various structures set out above for FIGS. 1-6, integrated circuit 100 according to one embodiment of this disclosure may include semiconductor structure 104 positioned on substrate 102. Semiconductor structure 104 may include one or more source/drain regions 150, 152. First dielectric cap layer 110 may be positioned on the upper surface of semiconductor structure 104. Spacers 118, 119 may be positioned over semiconductor structure 104. Metal gate 120 may be positioned on semiconductor structure 104 positioned in openings through first dielectric cap layer 110, e.g., in a replacement metal gate process. Metal gate 120 may include a gate dielectric 122, work function metal 124, and conductive plug 126 including at least a first metal. Metal cap 130 may be positioned on metal gate 120. First inter-layer dielectric (ILD) 114 may be positioned on first dielectric cap layer 110 and surrounding spacers 118, 119 and metal gate 120. Second dielectric cap layer 112 may be positioned over first ILD 114, spacers 118, 119, and metal cap 130. Second ILD 116 may be positioned on second dielectric cap layer 112. Gate contact 140 may be positioned on and in electrical contact with metal cap 130. Source/drain contacts 142, 144 may be positioned on and in electrical contact with source/drain regions 150, 152.

The upper surface of metal gate 120 may be recessed below the upper surface of first ILD 114. Metal cap 130 may be positioned on the recessed upper surface of metal gate 120 so as to cover the entire upper surface of metal gate 120. Metal cap 130 may have a thickness in the range of approximately 0.5 nanometer (nm) to approximately 5 nm and have an upper surface above, below, or co-planar with the upper surface of first ILD 114. In some embodiments, a metal cap thinner than 5 nm may be preferred, for example, less than 1.5 nm. As will be described herein, one benefit of including recessed metal gate 120 and metal cap 130 is a reduction in failures due to metal residue on the upper surface of first ILD 114. Other benefits may include reduction in gate resistance, reduction in gate metal oxidation, and increased tolerance of gouging of upper surface of metal gate 120 occurring during manufacturing steps. Metal cap 130 may include any metal with a different composition than materials included in metal gate 120. In one embodiment, metal cap 130 includes at least one of ruthenium (Ru), cobalt (Co), and tungsten (W).

Figure 8:
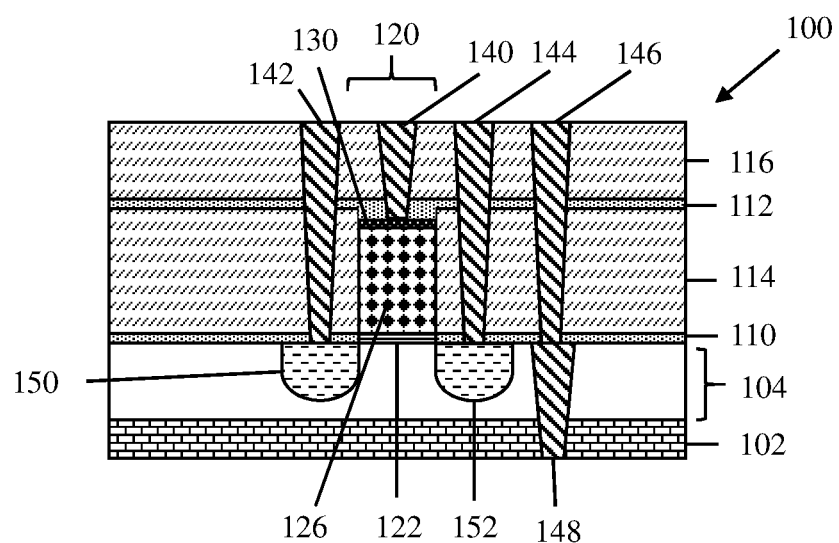
FIG. 8 shows a cross section through an integrated circuit including a through silicon via (TSV) according to embodiments of this disclosure.

Referring to cross-section view of FIG. 8, integrated circuit 100 according to another embodiment of this disclosure may include semiconductor structure 104 positioned on substrate 102. Semiconductor structure 104 may include one or more source/drain regions 150, 152 and may also include through silicon via (TSV) 148. First dielectric cap layer 110 may be positioned on the upper surface of semiconductor structure 104. Metal gate 120 may be positioned on semiconductor structure 104 positioned in openings through first dielectric cap layer 110. Metal gate 120 may include a gate dielectric 122, and gate conductor 126 including at least a first metal. Metal cap 130 may be positioned on metal gate 120. First inter-layer dielectric (ILD) 114 may be positioned on first dielectric cap layer 110 and abutting metal gate 120. Second dielectric cap layer 112 may be positioned on first ILD 114 and metal cap 130. Second ILD 116 may be positioned on second dielectric cap layer 112. Gate contact 140 may be positioned on and in electrical contact with metal cap 130. Source/drain contacts 142, 144 may be positioned on and in electrical contact with source/drain regions 150, 152. TSV contact 146 may be positioned on and in electrical contact with TSV 148.

Figure 9:
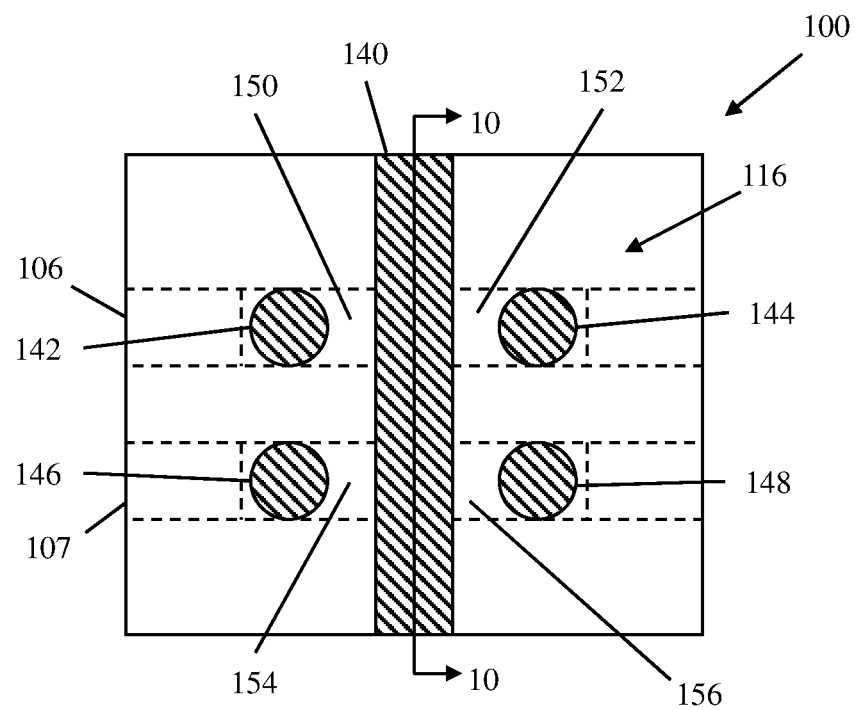
FIG. 9 shows a plan view of integrated circuit including fins according to embodiments of this disclosure.
Figure 10:
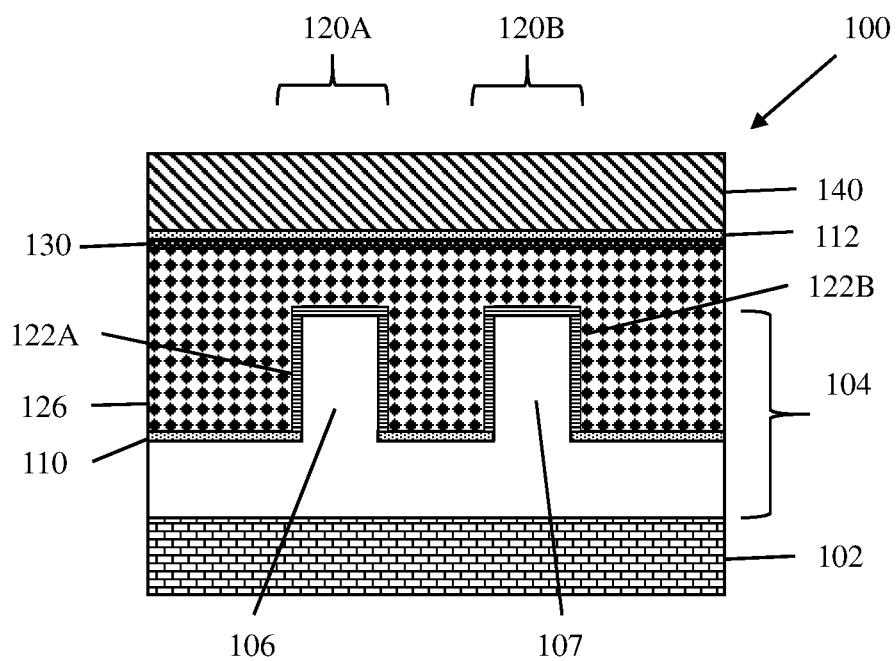
FIG. 10 shows a cross section of an integrated circuit including fins according to embodiments of this disclosure.

Referring to FIGS. 9 and 10 together, FIG. 9 shows a plan view and FIG. 10 shows a cross-section view of the same integrated circuit 100 according to another embodiment of this disclosure which includes two fins within semiconductor structure 104. For clarity, some hidden structures are omitted from each figure and others are shown in phantom. Integrated circuit 100 may include semiconductor structure 104 positioned on substrate 102. Semiconductor structure 104 may include fins 106 and 107 extending upwards. Semiconductor structure 104 may also include one or more source/drain regions 150, 152, 154, 156. First dielectric cap layer 110 may be positioned on the upper surface of semiconductor structure 104. Spacers 118 and 119 (not shown) may be positioned above semiconductor structure 104 laterally abutting metal gate 120. Metal gate 120 may be positioned on semiconductor structure 104 positioned on fins 106, 107. Metal gate 120 may additionally contact all or a portion of the lateral sides of fins 106, 107. Metal gate 120 may include a gate dielectric 122, and gate conductor 126 including at least a first metal. Metal cap 130 may be positioned on metal gate 120. First inter-layer dielectric (ILD) 114 may be positioned on first dielectric cap layer 110 and abutting at least one of metal gate 120 and spacers 118, 119. Second dielectric cap layer 112 may be positioned on first ILD 114 (not shown), spacers 118, 119 (not shown), and metal cap 130. Second ILD 116 may be positioned on second dielectric cap layer 112. Gate contact 140 may be positioned on and in electrical contact with metal cap 130. Source/drain contacts 142, 144, 146, 148 may be positioned on and in electrical contact with source/drain regions 150, 152, 154, 156.

Figure 11:
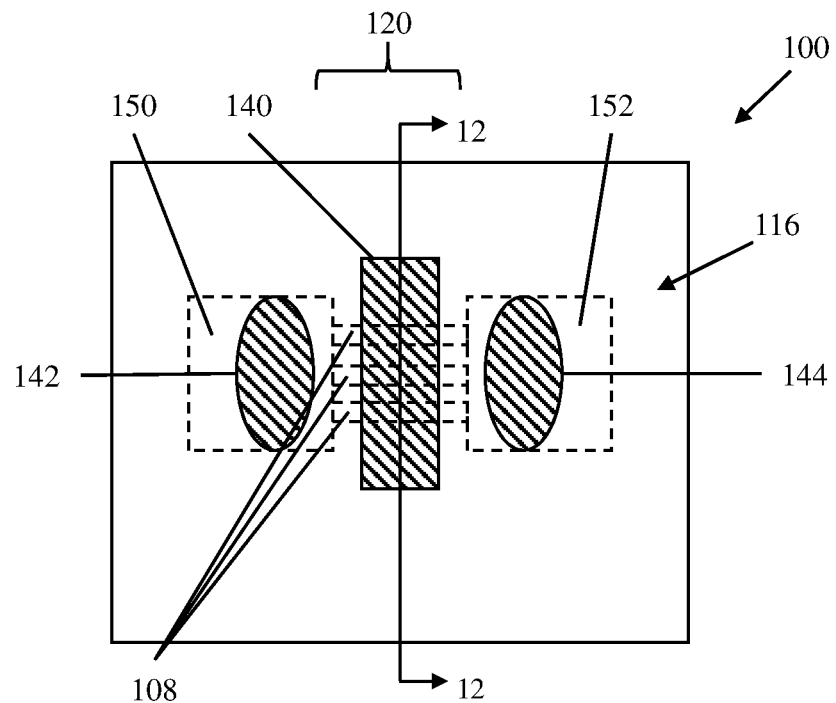
FIG. 11 shows a plan view of an integrated circuit including nanowires according to embodiments of this disclosure.
Figure 12:
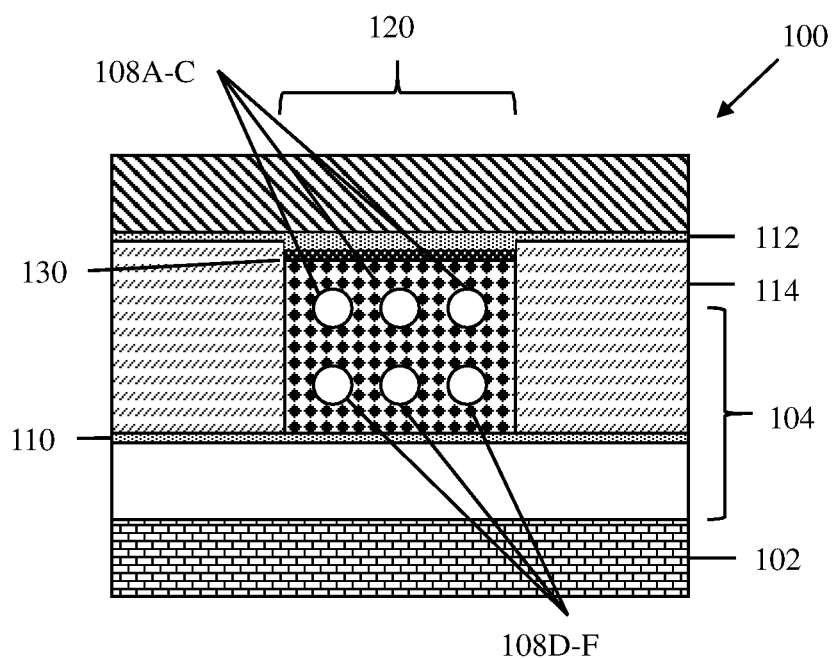
FIG. 12 shows a cross section of an integrated circuit including nanowires according to embodiments of this disclosure.

Referring to FIGS. 11 and 12 together, FIG. 11 shows a plan view and FIG. 12 shows a cross-section view of the same integrated circuit 100 according to another embodiment of this disclosure. For clarity, some hidden structures are omitted from each figure and others are shown in phantom. Integrated circuit 100 may include semiconductor structure 104 positioned on substrate 102. Semiconductor structure 104 may include one or more source/drain regions 150, 152. Semiconductor structure 104 may also include nanowires 108A-F extending between first source/drain region 150 and second source/drain region 152. First dielectric cap layer 110 may be positioned on a portion of the upper surface of semiconductor structure 104. Metal gate 120 may be positioned on semiconductor structure 104 between source/drain regions 150, 152 and surrounding nanowires 108A-F. Metal gate 120 may include a gate dielectric 122 (not shown) surrounding nanowires 108A-F, and gate conductor 126 including at least a first metal. Metal cap 130 may be positioned on metal gate 120. First inter-layer dielectric (ILD) 114 may be positioned on first dielectric cap layer 110 and abutting metal gate 120. Second dielectric cap layer 112 may be positioned on first ILD 114 and metal cap 130. Second ILD 116 may be positioned on second dielectric cap layer 112. Gate contact 140 may be positioned on and in electrical contact with metal cap 130. Source/drain contacts 142, 144 may be positioned on and in electrical contact with source/drain regions 150, 152.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure.

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used throughout the descriptions presented herein and should generally be given the following meaning unless contradicted or elaborated upon by other descriptions set forth herein. Some of the terms set forth herein may be registered trademarks (®).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure comprising:
a semiconductor structure;
a first source/drain region formed in the semiconductor structure;
a second source/drain region formed in the semiconductor structure;
a metal gate positioned on the semiconductor structure adjacent to and between the first source/drain region and the second source/drain region, the metal gate including a first metal;
a metal cap positioned on the metal gate, wherein the metal cap has a different metal composition than the first metal;
a first dielectric cap layer having a bottom surface positioned on and in direct contact with at least a portion of an upper surface of the semiconductor structure;
a first inter-layer dielectric (ILD) positioned above the semiconductor structure and laterally abutting both the metal cap and the metal gate, wherein a height of an upper surface of the first ILD above the semiconductor structure is greater than a height of an upper surface of the metal gate above the semiconductor structure;
a second dielectric cap layer positioned on the first ILD and above the metal cap;
a first contact on and in electrical contact with an upper surface of the metal cap, wherein the second dielectric cap layer laterally abuts a portion of the first contact; and
a second contact extending through the first dielectric cap layer to the first source/drain region, wherein the second dielectric cap layer laterally abuts a portion of the second contact, and wherein the second contact is electrically isolated from the first contact.

2. The integrated circuit structure of claim 1, wherein the metal cap includes ruthenium (Ru).

3. The integrated circuit structure of claim 1, further comprising:
a through silicon via (TSV) positioned within the semiconductor structure; and
a second contact extending through the first dielectric cap layer to the TSV,
wherein the second dielectric cap layer laterally abuts a portion of the second contact, and wherein the second contact is electrically isolated from the first contact.

4. The integrated circuit structure of claim 1, wherein the semiconductor structure includes a fin, wherein the first source/drain region and second source/drain region are both formed in the fin, and wherein the metal gate is positioned on the fin.

5. The integrated circuit structure of claim 4, wherein the metal gate additionally contacts at least a portion of a lateral side surface of the fin.

6. The integrated circuit structure of claim 4, wherein the semiconductor structure includes:
a second fin;
a third source/drain region formed in the second fin;
a fourth source/drain region formed in the second fin;
wherein the metal gate is additionally positioned on the second fin between the third source/drain region and the fourth source/drain region.

7. The integrated circuit structure of claim 1, further comprising:
a nanowire positioned above the semiconductor structure and between the first source/drain region and the second source/drain region, wherein the metal gate surrounds and contacts at least a portion of the nanowire.

8. The integrated circuit structure of claim 1, wherein the metal gate comprises:
a high-K dielectric liner on the semiconductor structure;
a work function metal in contact with the liner; and
a conductive plug in contact with the work function metal and including the first metal,
wherein the work function metal has a different metal composition than the metal cap.

9. The integrated circuit structure of claim 8, wherein the work function metal includes titanium nitride (TiN).

10. The integrated circuit structure of claim 8, wherein the work function metal includes titanium aluminum carbide ($Ti_3AlC_2$).

11. The integrated circuit structure of claim 1, wherein the metal cap includes cobalt (Co).

12. The integrated circuit structure of claim 1, wherein the metal cap includes tungsten (W).

13. An integrated circuit (IC) structure comprising:
a semiconductor structure;
a first source/drain region formed in the semiconductor structure;
a second source/drain region formed in the semiconductor structure;
a gate stack positioned on the semiconductor structure adjacent to and between the first source/drain region and the second source/drain region, the gate stack including:
a high-K dielectric liner on the semiconductor structure;
a work function metal in contact with the liner; and
a conductive plug in contact with the work function metal;
a metal cap positioned on the gate stack, wherein the metal cap has a different metal composition than the work function metal and the conductive plug, and wherein the metal cap has a thickness in the range of approximately 0.5 nanometer (nm) to approximately 5 nm;
a first dielectric cap layer positioned on at least a portion of the semiconductor structure;
a first inter-layer dielectric (ILD) positioned above the semiconductor structure and laterally abutting both the metal cap and the gate stack, wherein a height of an upper surface of the first ILD above the semiconductor structure is greater than a height of an upper surface of the gate stack above the semiconductor structure;
a second dielectric cap layer positioned on the first ILD and above the metal cap;
a gate contact on and in electrical contact with an upper surface of the metal cap, wherein the second dielectric cap layer laterally abuts a portion of the gate contact; and
a second contact extending through the first dielectric cap layer above and in electrical contact with the first source/drain region, wherein the second dielectric cap layer laterally abuts a portion of the second contact, and wherein the second contact is electrically isolated from the gate contact.

14. The integrated circuit structure of claim 13, wherein the metal cap includes ruthenium (Ru).

15. The integrated circuit structure of claim 13, wherein the semiconductor structure includes a fin, the integrated circuit further comprising:
a first spacer positioned on the fin adjacent to the gate stack, wherein a height of an upper surface of the first spacer above the fin is greater than a height of an upper surface of the gate stack above the fin; and
a second spacer positioned on the fin adjacent to the gate stack, wherein a height of an upper surface of the second spacer above the fin is greater than the height of the upper surface of the gate stack above the fin,
wherein the first source/drain region and the second source/drain region are both formed in the fin, and wherein the gate stack is positioned on the fin between the first spacer and the second spacer and contacts at least a portion of a lateral side surface of the fin.

16. The integrated circuit structure of claim 13, wherein the work function metal includes titanium nitride (TiN).

17. The integrated circuit structure of claim 13, wherein the metal cap includes cobalt (Co).

18. The integrated circuit structure of claim 13, wherein the metal cap includes tungsten (W).

19. The integrated circuit structure of claim 13, wherein the work function metal includes titanium aluminum carbide ($Ti_3AlC_2$).

* * * * *